United States Patent [19]

Asano

[11] Patent Number: 5,125,784

[45] Date of Patent: Jun. 30, 1992

[54] WAFERS TRANSFER DEVICE

[75] Inventor: Takanobu Asano, Yokohama, Japan

[73] Assignee: Tel Sagami Limited, Kanagawa, Japan

[21] Appl. No.: 643,084

[22] Filed: Jan. 22, 1991

[30] Foreign Application Priority Data

Mar. 11, 1988 [JP] Japan .................. 63-58794

Related U.S. Application Data

[63] Continuation of Ser. No. 563,668, Aug. 6, 1990, abandoned, which is a continuation of Ser. No. 320,962, Mar. 9, 1989, abandoned.

[51] Int. Cl.$^5$ .............................. B65B 21/02
[52] U.S. Cl. .................... 414/404; 414/417
[58] Field of Search ........ 414/404, 416, 417; 294/86.4, 119.1

[56] References Cited

U.S. PATENT DOCUMENTS

| | | | |
|---|---|---|---|
| 4,466,766 | 8/1984 | Geren et al. | 414/404 |
| 4,536,122 | 8/1985 | Herrmann et al. | 414/404 |
| 4,566,839 | 1/1986 | Butler | 414/404 |
| 4,568,234 | 2/1986 | Lee et al. | 414/404 |
| 4,573,851 | 3/1986 | Butler | 414/417 X |
| 4,611,966 | 9/1986 | Johnson | 414/404 |
| 4,695,217 | 9/1987 | Lau | 414/404 |
| 4,699,556 | 10/1987 | Foulke | 414/404 |
| 4,856,957 | 8/1989 | Lau et al. | 414/404 |

FOREIGN PATENT DOCUMENTS 61-244040 10/1986 Japan .

Primary Examiner—H. Grant Skaggs
Assistant Examiner—James R. Bidwell
Attorney, Agent, or Firm—Oblon, Spivak, McClelland, Maier & Neustadt

[57] ABSTRACT

A wafer transfer device which includes a lifter system for lifting wafers seated in a cassette, a chuck system having at least two pairs of chuck members on each of which a plurality of grooves for holding the wafers therein are formed and serving to hold the wafers, which are lifted by the lifter system, between these chuck members, and a carrier system for carrying the wafers together with the chuck system. The wafer holding grooves on one of the paired chuck members are in series with those on one of the other paired chuck members, and the wafer holding grooves on one of the paired chuck members are parallel to those on one of the other paired chuck members.

6 Claims, 13 Drawing Sheets

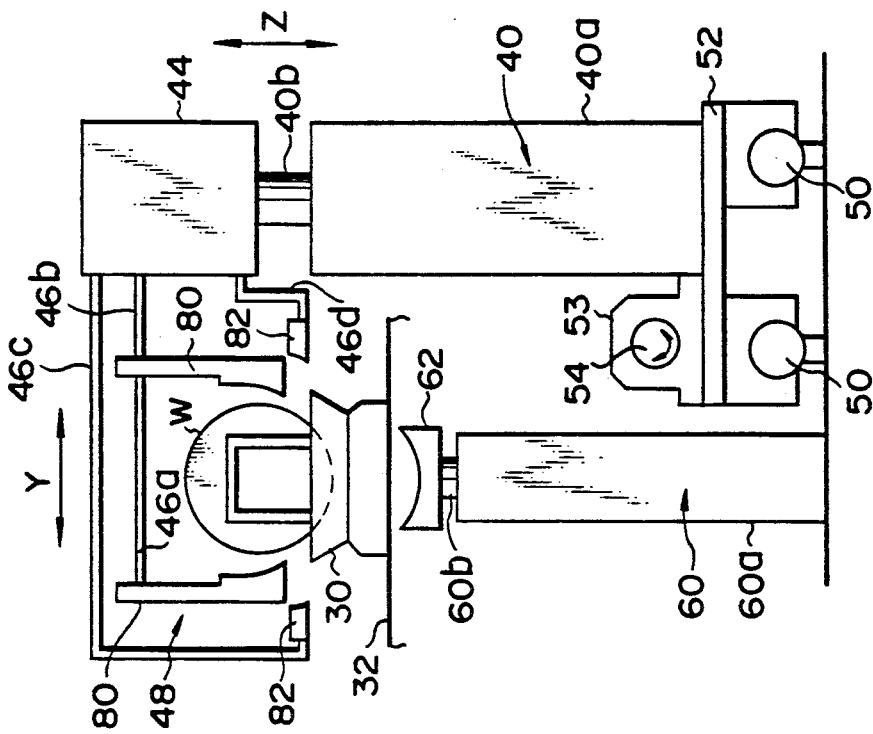
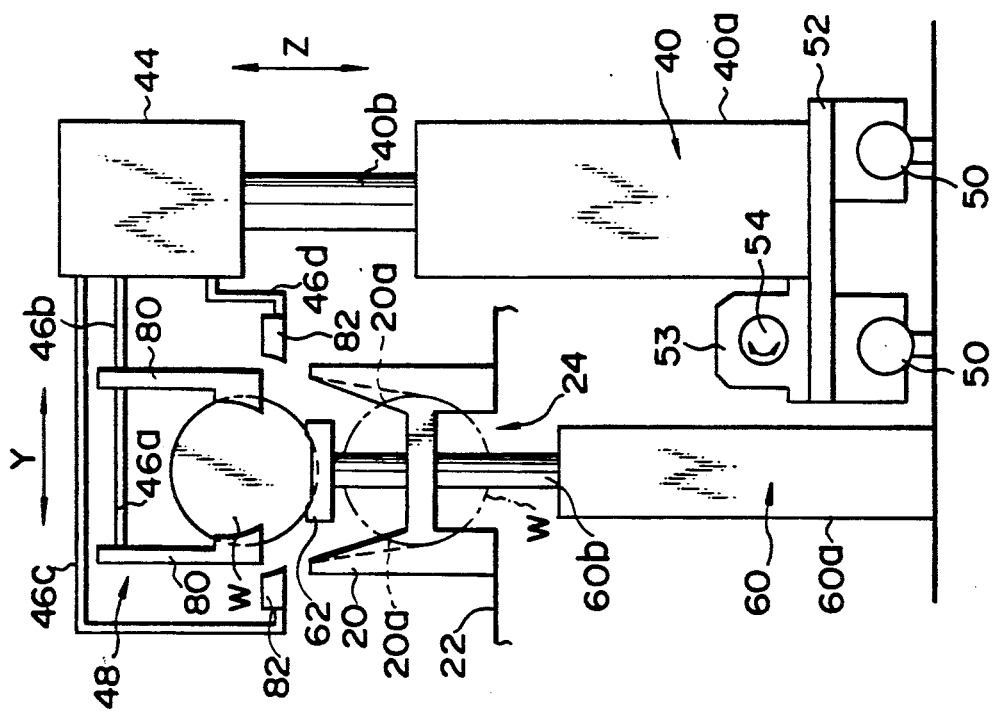

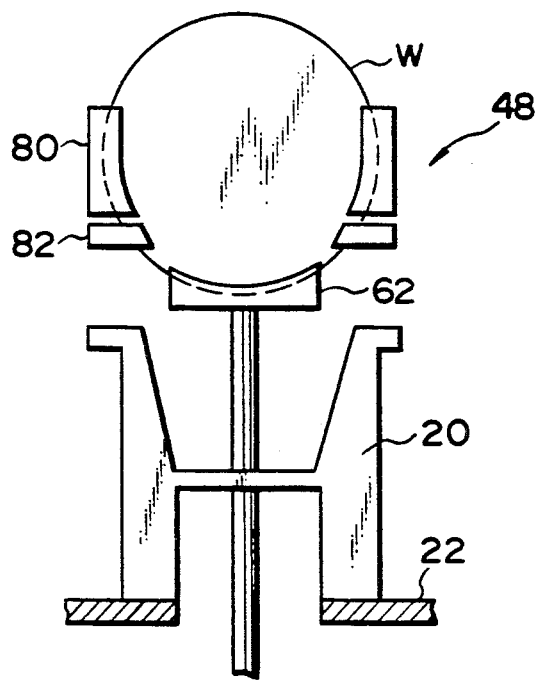
F I G. 15
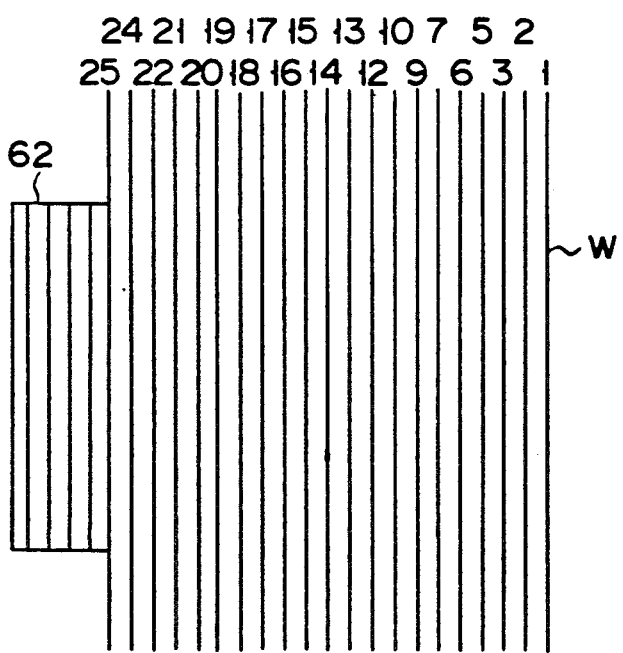
F I G. 16

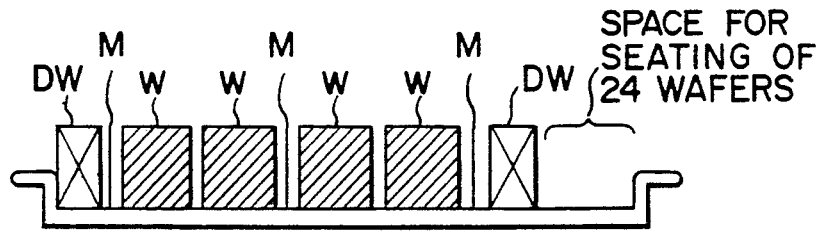
FIG. 18 PRIOR ART
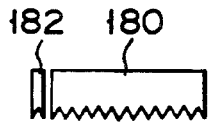 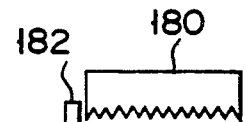
FIG. 19A   FIG. 19B   FIG. 19C
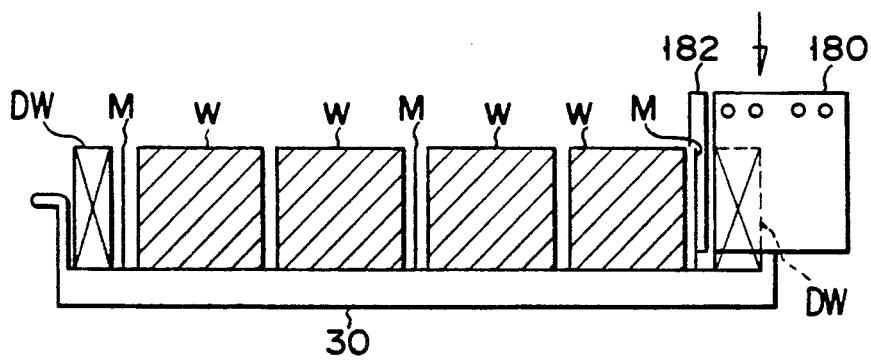
FIG. 20
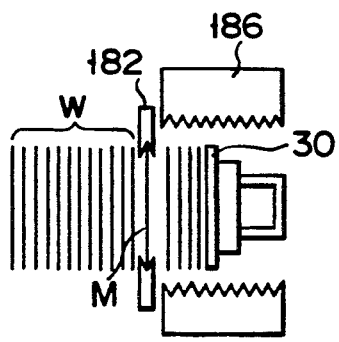
FIG. 21

WAFERS TRANSFER DEVICE

This application is a continuation of application Ser. No. 07/563,668, filed on Aug. 6, 1990, now abandoned, which is a continuation of Ser. No. 07/320,962, filed Mar. 9, 1989 now abandoned.

BACKGROUND OF THE INVENTION

1. Field of the Invention

The present invention relates to a device for transferring semiconductor wafers from cassettes to a boat and from the boat to the cassettes.

2. Description of the Related Art

In the case of the semiconductor elements manufacturing apparatus, a plurality of wafers mounted on a boat made of quartz are loaded into the heat process section and a heat diffusion process is applied there to the wafers as a unit.

Prior to applying this heat diffusion process to the wafers, the wafers housed in a cassette must be transferred from the cassette onto a boat by means of a transfer device for the wafers.

The transfer device for the wafers has a pair of chuck members to carry out this transferring of wafers. A plurality of grooves parallel to one another are formed on those faces of the chuck members which are opposed to each other, at the same pitch as the grooves of the cassette.

The wafers housed in the cassette are lifted to a certain level above the cassette by means of the lifter means, held between the chuck members, and carried to the boat. The wafers are loaded on the boat in those grooves which are formed on the inner face of the boat at a certain pitch interval.

This transferring or loading of wafers is repeated relative to plural cassettes placed on a cassette table to successively transfer the wafers from the cassettes to the boat.

Up to twenty-five pieces of wafers are usually housed in the cassette at a pitch or spacing interval of 3/16 inches and mounted on the boat at the same pitch interval by means of the transfer device for the wafers.

However, various kinds of processes are applied to the wafers, and the wafers have various sizes. Therefore, it is sometimes necessary that the wafers are transferred onto the boat at a pitch interval of 6/16 inches or 9/16 inches different from that of wafers holding grooves in the cassette and two, three or more times that of the wafers holding grooves in the cassette.

Japanese Utility Model Publication Sho 61-33443 discloses a transfer device for wafers which is capable of changing the pitch interval of the wafers mounted on the boat. As shown in FIG. 1, first grooves 14a for holding wafers and second grooves 14b for holding no wafer are formed alternately and parallel to one another on the inner face of each of the chuck members at the pitch interval of 3/16 inches.

Twenty-five, twenty and twenty-five pieces of wafers are housed in cassettes 10A, 10B and 10C, respectively, at the pitch interval of 3/16 inches, as shown in FIG. 2A. Let us assume that the wafers in each of the cassettes are transferred onto boat 12 at the pitch interval of 6/16 inches. Fixing dummy wafers 16 are previously mounted on boat 12 at both ends thereof.

Twenty-five pieces of wafers are lifted above cassette 10A by means of the lifter means (not shown) and held between chuck members 14, as shown in FIG. 2B. First and second grooves 14a and 14b are alternately formed on each of the chuck members 14. Therefore, only uneven-numbered wafers of those twenty-five pieces of wafers shown in FIG. 3A are held between chuck members 14 and transferred on boat 12 at the pitch interval of 6/16 inches, as shown in FIG. 2C (wafers WA1 shown in FIG. 2C).

Chuck members 14 are shifted from their previous position by 3/16 inches to hold the remaining even numbered wafers between them, as shown in FIG. 2C. The wafers thus held are transferred onto boat 12 at the pitch interval of 6/16 inches, as shown in FIG. 2D (wafers WA2 shown in FIG. 2D).

This transferring operation of the wafers is repeated relative to cassettes 10B and 10C, as shown in FIGS. 2D through 2E. A plurality of wafers are finally arranged on boat 12 at the pitch interval of 6/16 inches, as shown in FIG. 2F.

In the case of the conventional wafers transfer device, however, wafers W which are housed in cassette 10 at the pitch interval of 3/16 inches with no wafer missing can be transferred onto boat 12 at the pitch interval of 6/16 inches which is different from that of wafers W housed in cassette 10, but wafers W which are housed in cassette 10 with some of them missing cannot be transferred onto boat 12 at a desired pitch interval.

When wafers W which are housed in cassette 10 with some of them missing as shown in FIG. 3B are transferred onto boat 12 by means of the conventional wafer transfer device, they are also arranged on boat 12 with some of them missing as shown in FIG. 4.

Particularly when some of wafers are missing from those transferred onto boat 12 as shown in FIG. 4, those conditions under which processes are applied to wafers W become different in relation to some of wafers W. When diffusion and CVD processes are applied to wafers which are arranged onto boat 12 with some of them missing, a film formed on each of wafers W becomes different in quality and property.

SUMMARY OF THE INVENTION

The object of the present invention is to provide a transfer device for wafers which is capable of transferring from cassettes to a boat those wafers, which are housed in each of the cassettes with some of them missing, at a desired pitch interval.

According to an aspect of the present invention, there can be provided a transfer device for wafers comprising a lifter means for lifting wafers seated in a first wafers seating means above the first wafers seating means; a holder means having at least two pairs of chuck members on each of which a plurality of grooves for holding wafers therein are formed at a certain pitch interval and holding the wafers lifted by the lifter means between these chuck members; and a carrier means for carrying the wafers together with the holder means to a second wafers seating means; wherein at least two pairs of the chuck members have drive means which are independent of one other to drive the paired chuck members.

According to another aspect of the present invention, there can be provided a wafers transfer device including at least two pairs of chuck members of a holder means wherein wafers holding grooves on one of the paired chuck members are in series with those on a corresponding one of the other paired chuck members.

According to a further aspect of the present invention, there can be provided a transfer device for wafers including at least two pairs of chuck members of a holder means wherein wafer holding grooves on one of the paired chuck members are parallel to those on a corresponding one of the other paired chuck members.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 shows wafers being transferred from the cassette to chuck members of the wafer transfer device according to the present invention, when viewed in the longitudinal direction of the device;

FIG. 7 shows wafers transferred from the chuck members of the wafer transfer device to the boat, when viewed in the longitudinal direction of the device.

FIG. 15 shows the lifter member and the chuck means viewed in the longitudinal direction of the wafer transfer device and kept as shown in FIG. 14A;

FIG. 16 is a plan view showing the lifter member viewed from above when the re-arranging of wafers is finished;

FIG. 18 schematically shows monitor and product wafers mounted on the boat to explain the positional arrangement of these wafers;

FIG. 19A through 19C are plans schematically showing the chuck means of the second wafers transfer device to explain the closing and opening of first and second chuck members of the chuck means;

FIG. 20 is a front view showing the chuck means of the second wafers transfer device and the boat schematically; and FIG. 21 is a plan view showing the chuck means of the second wafers transfer device and an end of the boat schematically to explain the monitor wafer held between the second chuck members of the chuck means.

DESCRIPTION OF THE PREFERRED EMBODIMENTS

Heat process furnaces (not shown) of the horizontal multideck type are arranged in a clean room and a soft landing device is located in front of each of the heat process furnaces. A wafer transfer device is located at the front side of the soft landing device.

Figure 1:
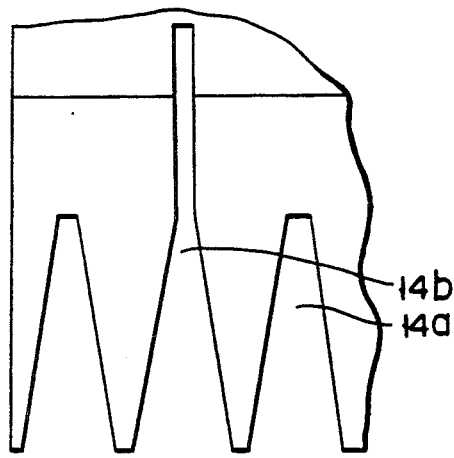
FIG. 1 is an enlarged view showing a part of the chuck member of the conventional transfer device for wafers.
Figure 2A:
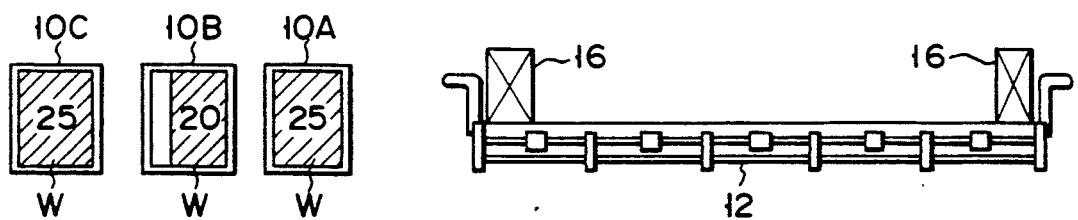
FIGS. 2A through 2F show a process of successively transferring wafers from each of cassettes to a boat, using the conventional wafer transfer device.
Figure 2B:
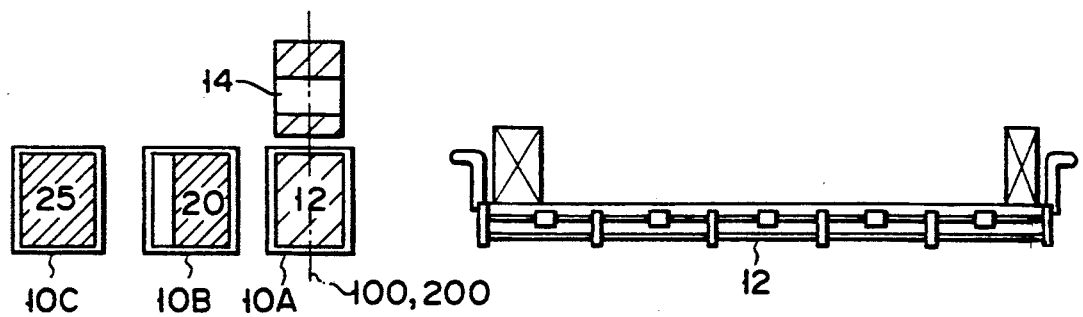
Figure 2C:
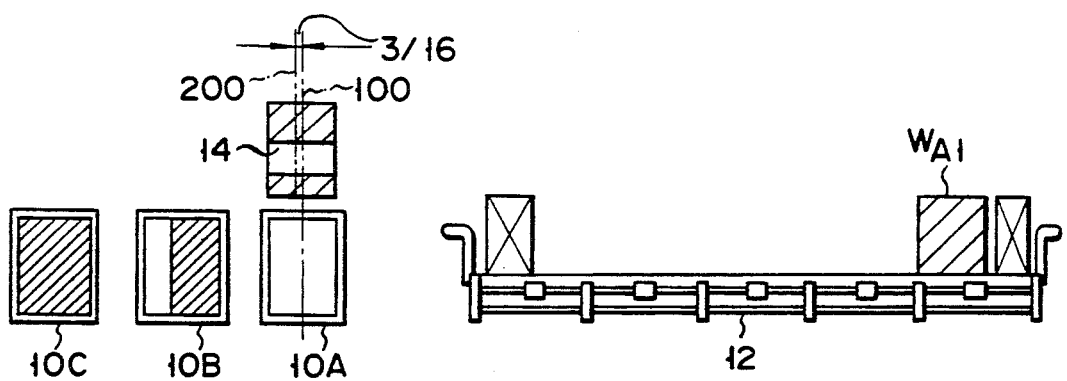
Figure 2D:
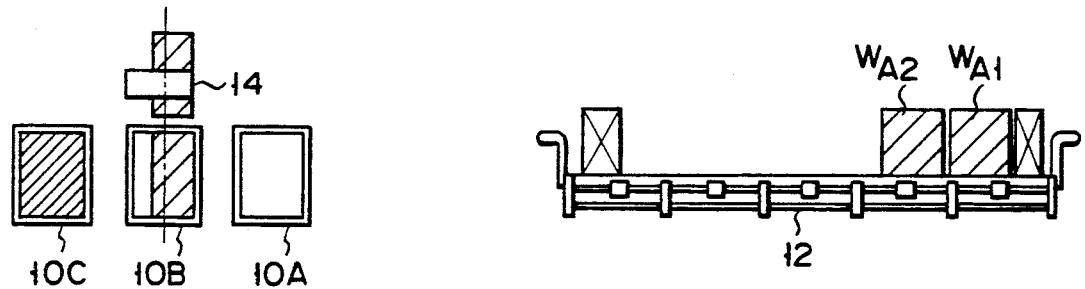
Figure 2E:
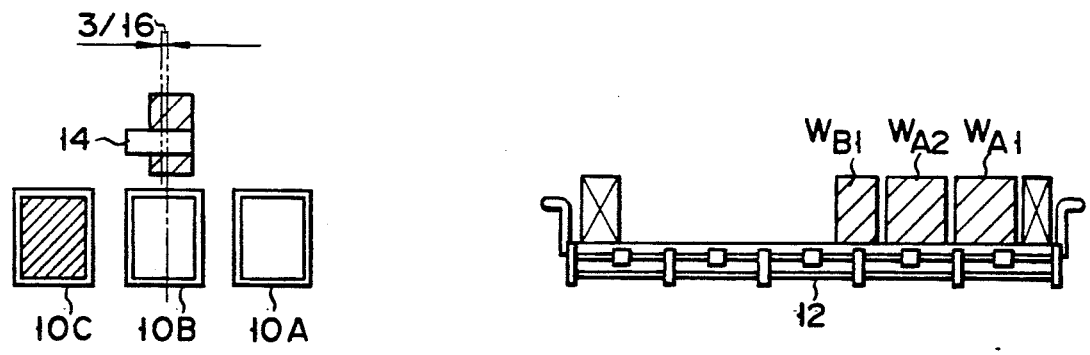
Figure 2F:
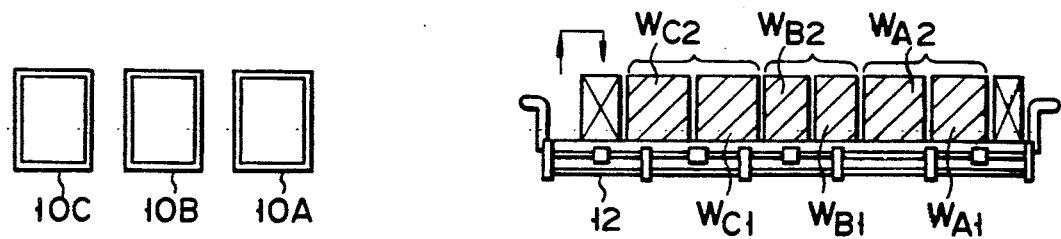
Figure 3A:
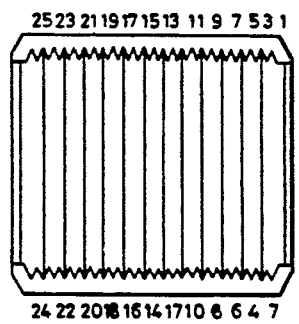
FIG. 3A is a sectional view showing wafers held in uneven-numbered grooves in the cassette when viewed in the longitudinal direction of the grooves.
Figure 3B:
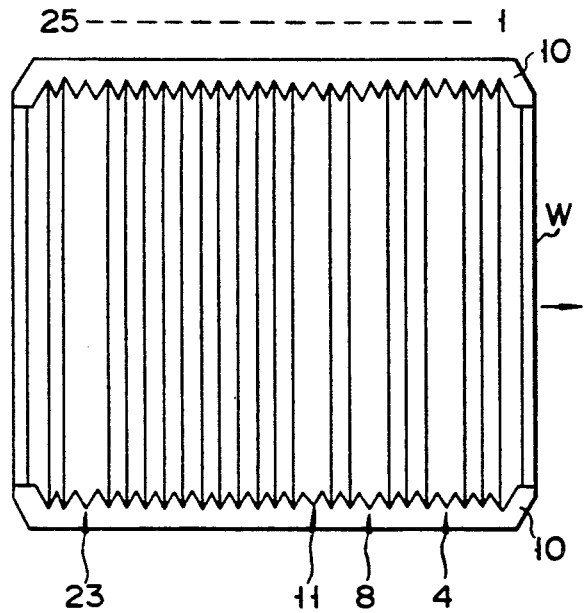
FIG. 3B is a sectional view showing some of the wafers missing from those in the cassette when viewed in the longitudinal direction of the grooves.
Figure 4:
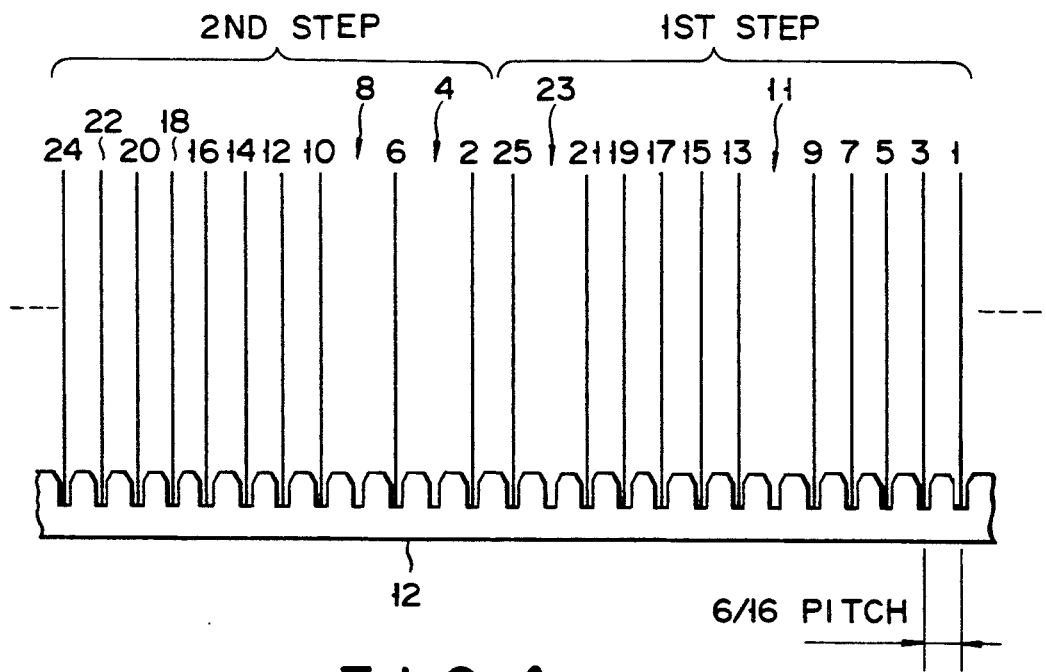
FIG. 4 shows those wafers, which are housed in the cassette with some of them missing as shown in FIG. 3B, transferred from the cassette to the boat by means of the conventional wafers transfer device.
Figure 5:
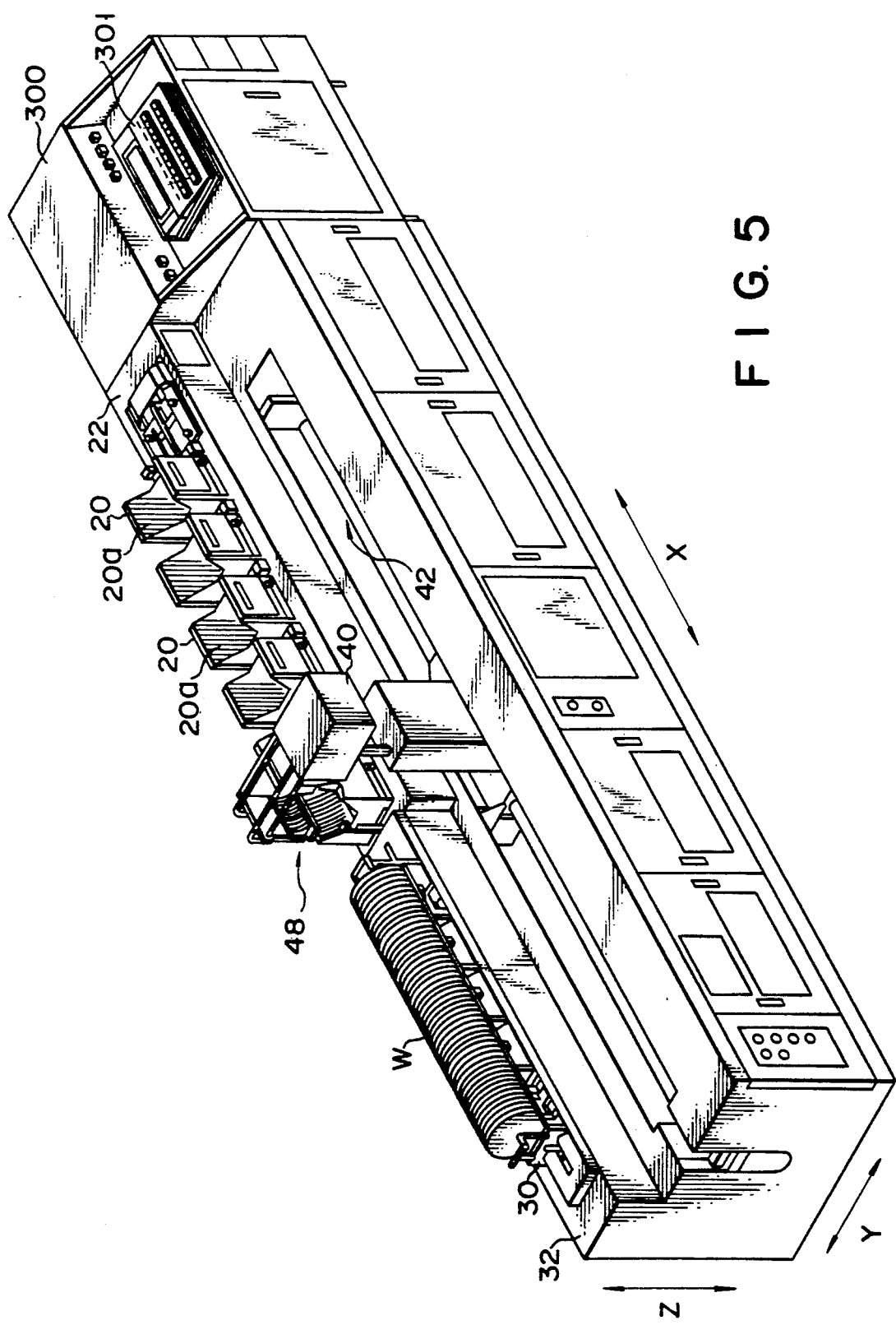
FIG. 5 is a perspective view showing the whole of an example of the wafer transfer device according to the present invention.

As shown in FIG. 5, the wafer transfer device includes cassette stage 22 on which plurality wafers are mounted and boat stage 32 on which boat 30 is mounted, cassette stage 22 and boat stage 32 being arranged at a substantially same level and in series. Groove 42 is formed parallel to these stages 22 and 32 and holder means 40 is located, movable in direction X, in groove 42. Various kinds of driver systems are housed in body 300 of the device. These driver systems are connected to a computer, into which data (or a number of wafers to be transferred to the boat, pitch interval at which the wafers are mounted on the boat, and the state under which wafers are housed in a cassette, for example) necessary for transferring wafers to the boat are input through keyboard 301.

As shown in FIG. 6, a pair of rails 50 are located on an inner bottom of body 300 along groove 42 and slider 52 can run on rails 50 in the direction of axis X.

Ball screw 54 is rotatably supported on slider 52 by means of nut 53. Ball screw 54 extends in the direction of axis X and it is connected to the driving shaft of a motor (not shown), which is controlled by the computer. When ball screw 54 is rotated a predetermined number of times by means of the motor, slider 52 can be moved by a predetermined distance in the direction of axis X.

Holder system 40 on slider 52 and wafers lifter system 60 adjacent to holder system 40 have air cylinders 40a and 60a, whose cylinder rooms are communicated with compression air supply sources (not shown), respectively. A flow rate control valve arranged at each of the air supply sources is controlled by the computer.

As shown in FIG. 6, a plurality of openings 24 are formed in cassette stage 22 at certain intervals. Cassettes 20 in which wafers W are housed are mounted on stage 22 in such a manner that bottom openings of cassettes 20 are communicated with their corresponding openings 24 in stage 22. When cassettes 20 are mounted on stage 22 in this manner, grooves 20a on each of cassettes 20 which serve to hold wafers are directed parallel to planes Y and Z. Those wafers which are housed in a cassette 20 which are formed of a material causing substantially no dust, are usually handled as a unit (or a lot) in the semiconductor elements manufacturing apparatus. Twenty-five grooves 20a for holding wafers are formed parallel to one another on a cassette 20 at a pitch interval of 3/16 inches and up to twenty-five pieces of wafers W are housed in a cassette 20.

Wafer lifter systems 60 are located just under openings 24 in cassette stage 22. Lifter member 62 is attached to the top of rod 60b of cylinder 60a. A plurality of grooves are formed on the surface of lifter member 62 at the pitch interval of 3/16 inches to meet the curved edges of wafers W.

Piston rod 40b of holder system 40 extends in the direction of axis Z and is connected to the underside of gear box (or head) 44 at the top thereof.

Gear box 44 houses four driver systems (not shown) therein. These driver systems serve to drive chuck means 48 opened and closed. Driving shafts of the driver systems are connected to paired arms 46a and 46a, 46b and 46b, 46c and 46c and 46d and 46d, respectively, said four-paired arms extending along axis X. First chuck members 80 are attached to front ends of paired arms 46a and 46b, respectively, while second chuck members 82 and 82 to front ends of paired arms 46c and 46d, respectively. First chuck members 80 are opposed to each other, serving as a pair of first chucks opened and closed, while second chuck members 82 are also opposed to each other, serving as a pair of second chucks opened and closed.

The driver systems which are connected to two-paired arms 46a and 46b through their driving shafts are associated with each other to retract paired arms 46b into head 44 while advancing paired arms 46a from head 44 (first chucks 80 are thus opened) and to advance paired arms 46b from head 44 while retracting paired arms 46a into head 44 (first chucks 80 and 80 are thus closed).

The driver systems which are connected to two-paired arms 46c and 46d through their driving shafts are associated with each other to retract paired arms 46d into head 44 while advancing paired arms 46c from head 44 (second chucks 82 are thus opened) and to advance paired arms 46d from head 44 while refracting paired arms 46c into head 44 (second chucks 82 are thus closed).

As shown in FIG. 7, wafers W are transferred to boat 30 on boat stage 32 from chuck means 48. Each of boats is mounted on stage 32 in such a way that its grooves for holding wafers are directed parallel to planes Y and Z.

Figure 9A:
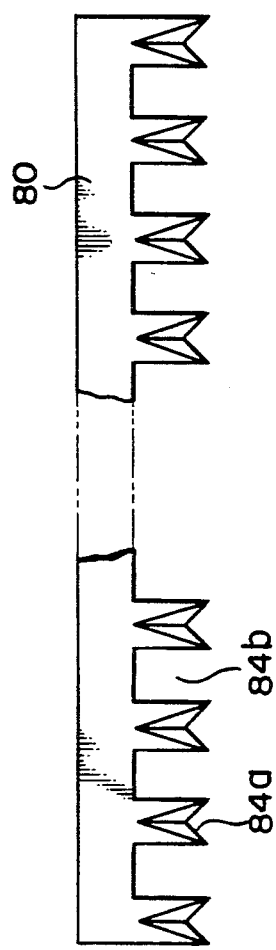
FIG. 9A shows grooves formed on each of first chuck members of the chuck means employed by the wafer transfer device according to the present invention, when viewed in the longitudinal direction of the grooves.
Figure 9B:
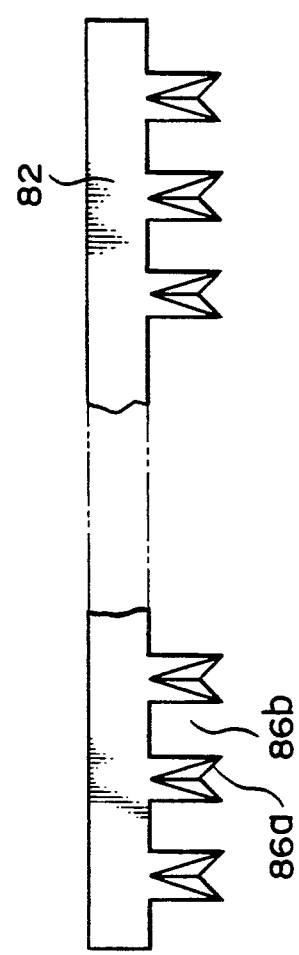
FIG. 9B shows grooves formed on each of second chuck members of the chuck means employed by the wafer transfer device according to the present invention, when viewed in the longitudinal direction of the grooves.
Figure 8:
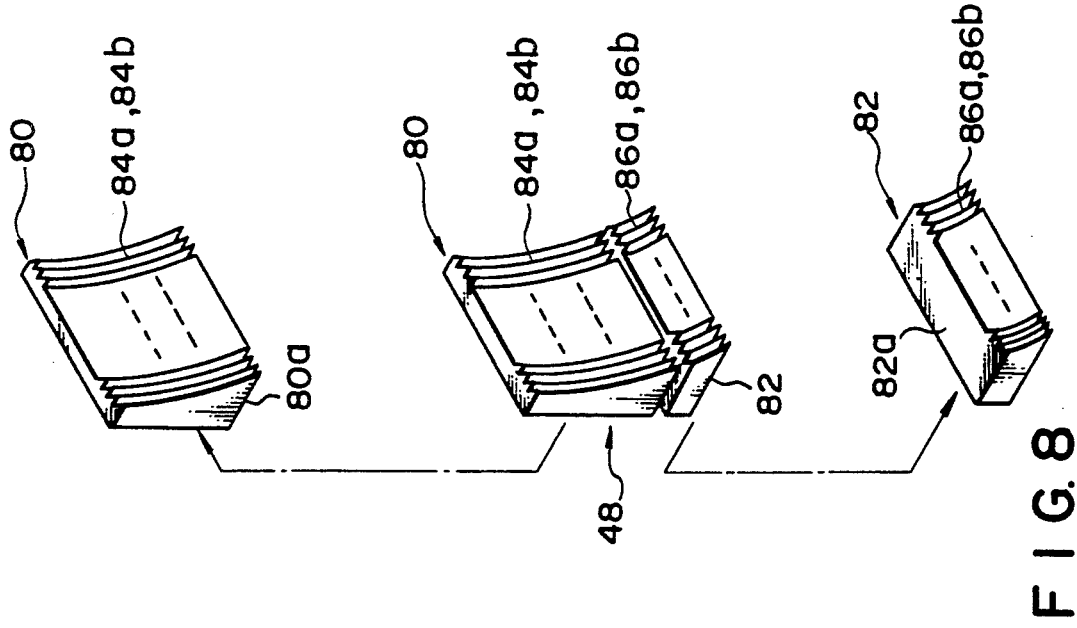
FIG. 8 is a perspective view showing halves of two paired chuck members of the wafer transfer device according to the present invention.

As shown in FIG. 8, chuck means 48 comprises first chuck members 80 and second chuck members 82 which are formed of a material causing substantially no dust, such as Derlin (trademark). Each first chuck member 80 comprises pairs of adjacent grooves 84a and 84b having different shapes and dimensions, as is shown in FIG. 9A; likewise each second chuck member 82 comprises pairs of adjacent grooves 86a and 86b having different dimensions, as is shown in FIG. 9B. First chuck member 80 and second chuck member 82 are assembled with each other in such a way that grooves 84a, 84b of first chuck member 80 are in series with those 86a, 86b of second chuck member 82. When chuck means 48 is at its waiting position, underside 80a of first chuck member 80 is opposed face to face to top 82a of second chuck member 82.

Two kinds of first and second grooves 84a and 84b are formed on that face of first chuck member 80 on which wafers are held, as shown in FIG. 9A. Each of the first grooves 84a is shaped like the letter "U" in horizontal section at its front end so as to hold the wafer therein, while each of second grooves 84b is rectangularly shaped so as not to hold the wafer therein. First and second grooves 84a and 84b are alternately arranged on first chuck member 80 at the pitch interval of 3/16 inches, totaling to 25.

Two kinds of first and second grooves 86a and 86b are also formed on that face of second chuck member 82 on which wafers are held, as shown in FIG. 9B. Each of first grooves 86a is shaped like the letter "U" in horizontal section at its front end so as to hold the wafer therein, while each of second grooves 86b is made rectangular not to hold the wafer therein. These first and second grooves 86a and 86b are alternately arranged on second chuck member 82 at the interval of 3/16 inches, totaling to twenty-five.

A case where wafers W housed in cassette 20 (at the pitch interval of 3/16 inches) are transferred to boat 30 by the wafers transfer device to have a pitch interval of 2 times or 6/16 inches on boat 30 will be described referring to FIGS. 10 through 13.

Figure 10:
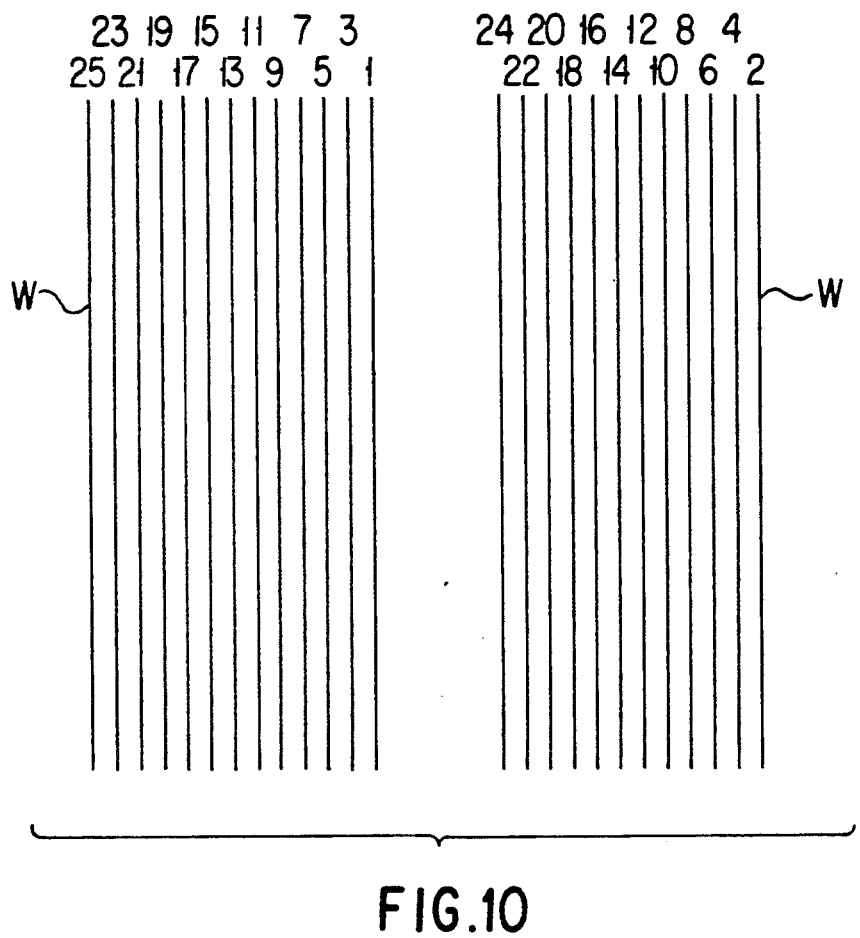
FIG. 10 shows the positional arrangement of wafers held between the first and second chuck members of the chuck means.

(I) As shown in FIG. 10, twenty-five pieces of semiconductor wafers W are seated in cassette 20. Holder system 40 is moved to cassette stage 22 and stopped at the front side of cassette 20. Both of first and second chucks 80 and 82 are kept open this time.

Figure 11A:
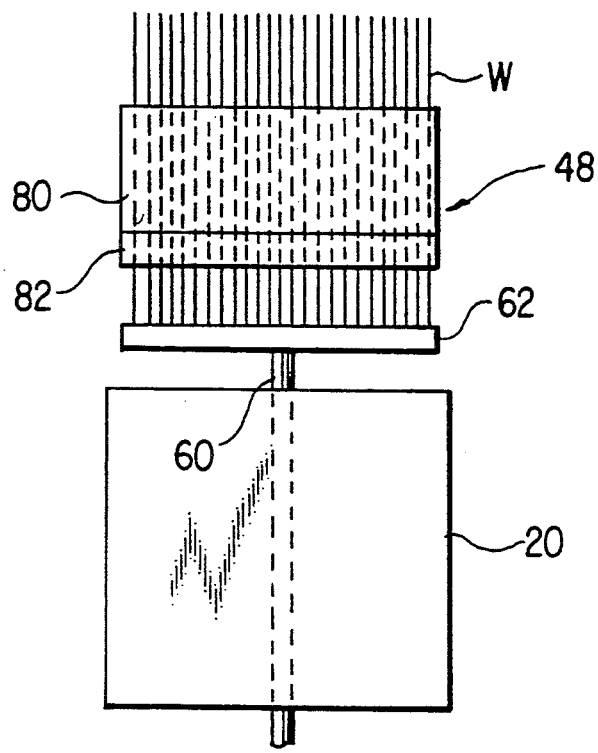
FIGS. 11A and 11B schematically show a part of the wafers transfer device to explain a first step of transferring wafers from the cassette to the boat at a pitch interval two times that of the wafers housed in the cassette.
Figure 11B:
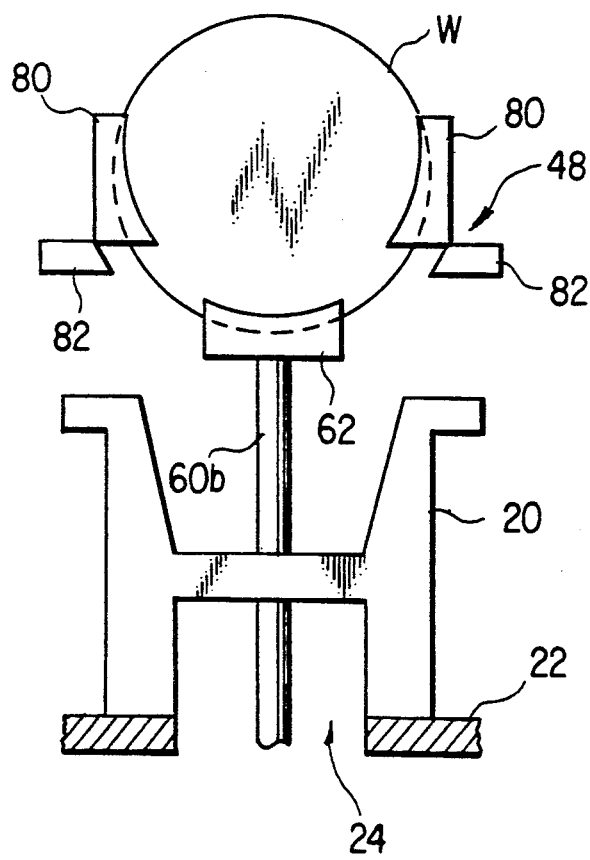
Figure 13:
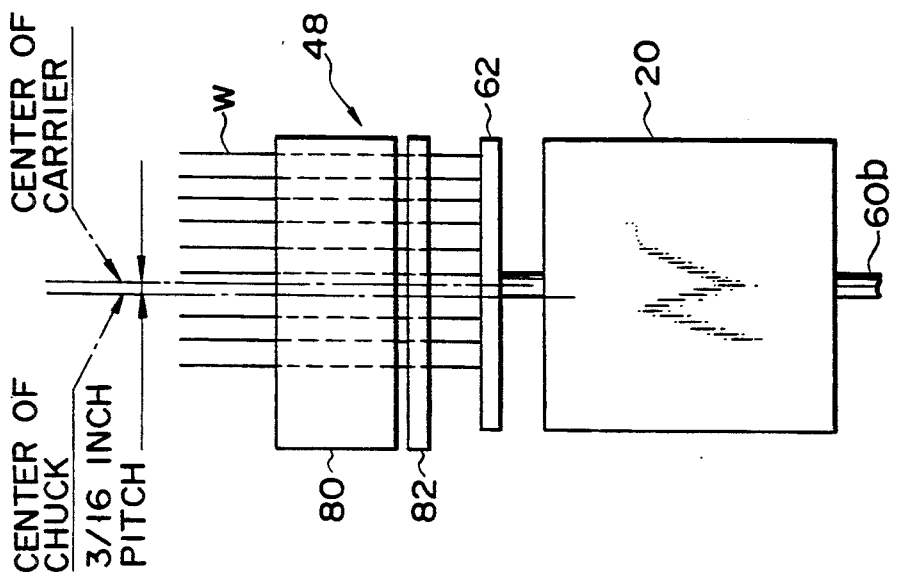
FIG. 13 schematically shows a part of the wafer transfer device to explain the second step in greater detail of transferring wafers from the cassette to the boat at the pitch interval two times that of the wafers housed in the cassette.
Figure 12B:
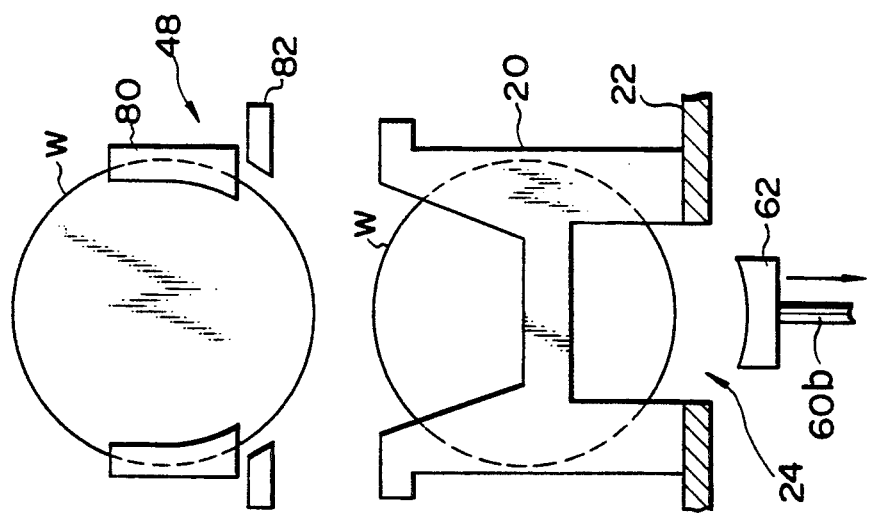
FIGS. 12A and 12B schematically show a part of the wafer transfer device to explain a second step of transferring wafers from the cassette to the boat at the pitch interval two times that of the wafers housed in the cassette.
Figure 12A:
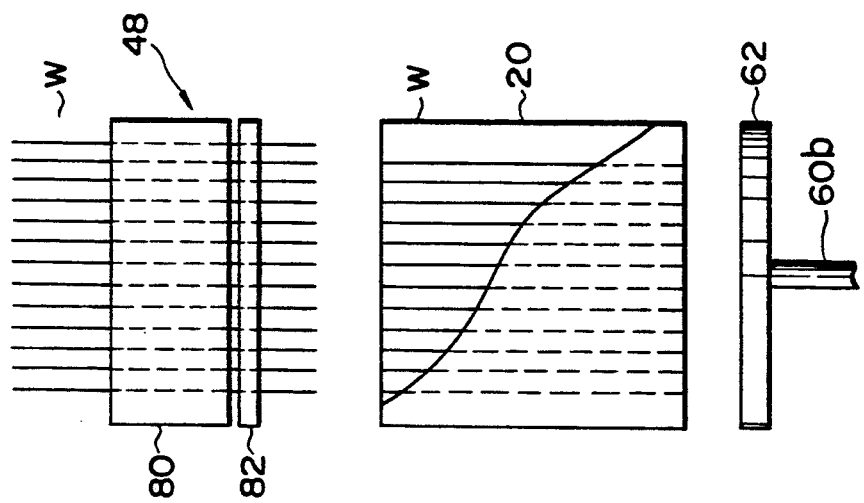

(II) Rod 60b of lifter system 60 is projected from cylinder 60a and all of wafers in the cassette are lifted above by lifter member 62. As shown in FIGS. 11A and 11B, first chuck members 80 are closed. Uneven-numbered wafers (1, 3, 5–25) shown in FIG. 10 are thus held in first grooves 84a of first chuck members 80.

(III) When rod 60b of lifter system 60 is retracted into cylinder 60a, only even-numbered wafers (2, 4, 6–24) are lowered together with lifter member 62. As the result, twelve pieces of wafers W are returned to cassette 20, while thirteen pieces of wafers W held between first chuck members 80 are left at their lifted position.

(IV) Holder system 40 is moved to boat stage 32 and stopped at the front side of boat 30. Wafers W are lowered to the level of boat 30 together with chuck member 48 and first chuck members 80 are opened to transfer wafers W onto boat 30 (see FIG. 7). As the result, thirteen pieces of wafers W are mounted on boat 30 at the pitch interval of 6/16 inches. In other words, wafers W are mounted on boat 30 at the pitch interval of 2 times that of grooves on cassette 20.

(V) Holder system 40 is then returned to cassette stage 22 and chuck means 48 is stopped at a position where the center of chuck means 48 is shifted from that of carrier or cassette 20 by 3/16 inches, as shown in FIG. 11A–13. Even-numbered wafers (2, 4, 6–24) in cassette 20 are lifted by lifter member 62 of lifter system 60 and held between first chuck members 80 to transfer them on boat 30 at an area next to uneven-numbered wafers W already mounted on boat 30. As the result, twenty-five pieces of wafers W in total are mounted on boat 30 at the pitch interval of 6/16 inches.

When wafers are to be transferred onto boat 30 at the usual pitch interval of 3/16 inches, first and second chuck members 80 and 82 are closed and opened at the same time to simultaneously grasp and hold uneven-numbered wafers between first chuck members 80 while also simultaneously holding even-numbered wafers between second chuck members 82.

Wafers transfer in a case where some pieces of wafers are not found in those housed in cassette 20 will be described referring to FIGS. 14A through 14E, 15 and 16.

(I) 21 pieces of wafers W are housed in cassette 20. A piece of wafer is not found at each of four positions in wafers W housed in cassette 20. Holder system 40 is moved to cassette stage 22 and stopped at the front side of cassette 20. Both of first and second chuck members 80 and 82 are kept open this time.

Figure 14A:
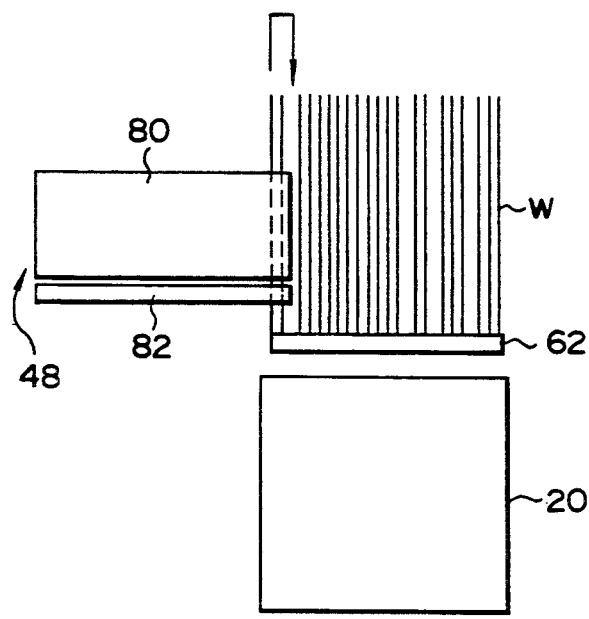
FIGS. 14A through 14E schematically show wafers lifted by a lifter member to explain a process of rearranging the wafers, which are housed in the cassette with some of them missing, at a certain pitch interval.

(II) Rod 60b of lifter system 60 is projected from cylinder 60a to lift all of the wafers in cassette 20 by lifter member 62. Only first chuck members 80 are closed to hold two pieces of wafers at left between them, as shown in FIG. 14A.

Figure 14B:
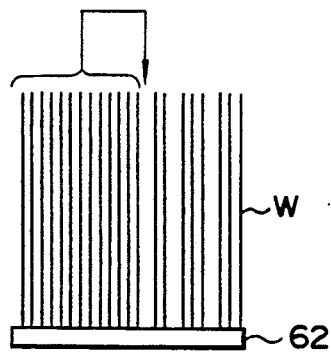

(III) Two pieces of wafers W at left are moved to right by 3/16 inches, moving chuck means 48 and lifter member 62 relative to each other. As the result, thirteen pieces of wafers are arranged on lifter member 62 at the pitch interval of 3/16 inches, as shown in FIG. 14B.

Figure 14C:
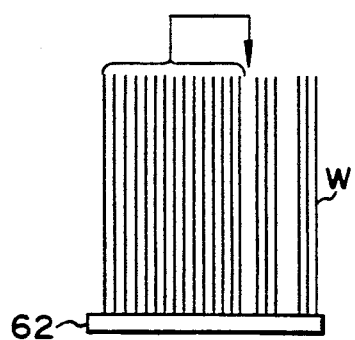

(IV) Operating chuck means 48 and lifter member 62 as described above, 13 pieces of wafers W at left are moved to right by the pitch interval of 3/16 inches and 15 pieces of wafers W are thus arranged on lifter member 62 at the pitch interval of 3/16 inches as shown in FIG. 14C, when viewed from left.

Figure 14D:
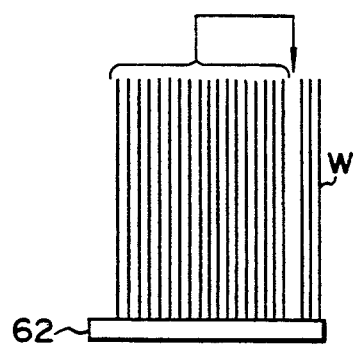
Figure 14E:
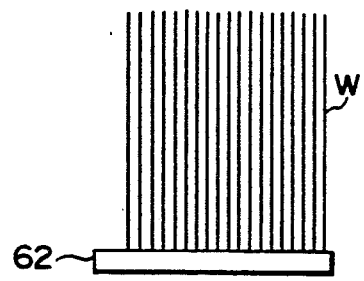

(V) Fifteen pieces of wafers W at left are further moved to right by the pitch interval of 3/16 inches and 18 pieces of wafers W are thus arranged on lifter member 62 at the pitch interval of 3/16 inches as shown in FIG. 14D, when viewed from left.

(VI) Eighteen pieces of wafers W at left are further moved to right by 3/16 inches. As the result, twenty-one pieces of wafers W are arranged on lifter member 62 at the pitch interval of 3/16 inches without any piece of wafer being missing in them.

Both of first and second chuck members 80 and 82 are closed at the same time to hold all of twenty-one pieces of wafers W between them. Holding twenty-one pieces of wafers W between first and second chuck members like this, holder system 40 is moved to boat stage 32 and stopped at the front side of boat 30. Wafers W are lowered together with chuck means 48 to the level of boat 30 and transferred onto boat 30, opening first and second chuck members 80 and 82 (see FIG. 7). As the result, twenty-one pieces of wafers W are mounted on boat at a certain area at the pitch interval of 3/16 inches.

Although wafers W on lifter member 62 have been successively re-arranged from left to right in the above-described case, they may be re-arranged from right to left.

When wafers W to which the diffusion process has been applied are to be unloaded from boat 30 to cassette 20, the above-described loading operation may be reversed.

A second example of the wafers transfer device according to the present invention will be described with reference to FIGS. 17 through 21. The same parts as those in the first example will be denoted by same reference numerals and description on these parts will be omitted.

Figure 17:
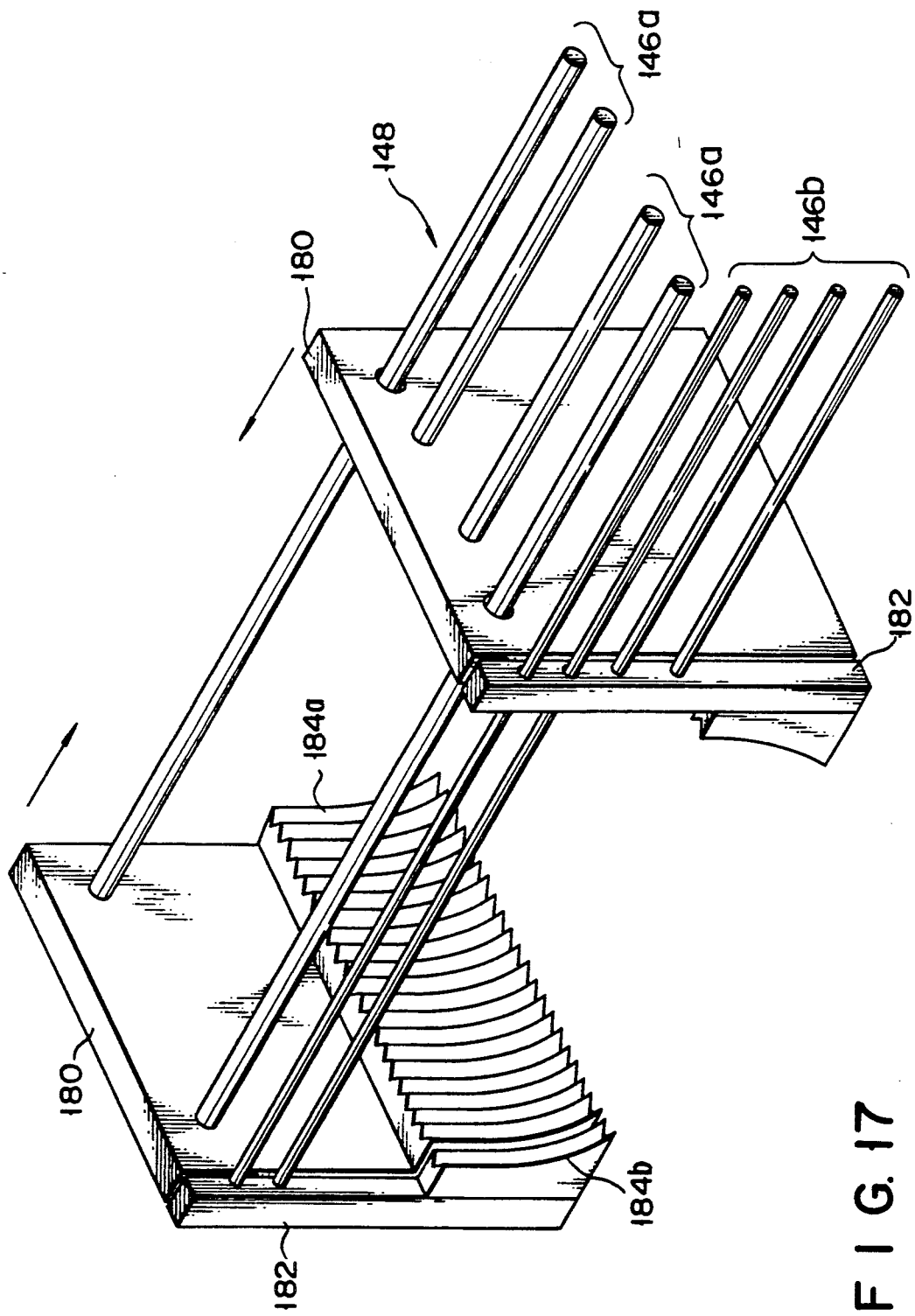
FIG. 17 is a perspective view showing a chuck means employed by a second example of the wafers transfer device according to the present invention.

As shown in FIG. 17, chuck means 148 in the second example of the wafers transfer device comprises first chuck members or main chuck 180 and second chuck or sub-chuck members 182. Main grooves 184a on the first chuck members 180 and a single sub-groove 184b on each of the second chuck members 182 are made parallel to one another. 180 and 182 are made parallel to one another. Second chuck members 182 have both a curved support portion and a straight guide portion as shown in FIG. 17.

Two of four arms 146a are connected to one of the first chuck members 180, passing through the other.

Two of four arms 146b are connected to the one of second chuck members 182, passing through the other.

Paired arms 146a are advanced and retracted independently of paired arms 146b.

It is assumed that monitor wafers M are mounted on boat 30 in addition to hatched product wafers W, as shown in FIG. 18.

When all of monitor wafers M and product wafers W shown in FIG. 18 are successively transferred onto boat 30 from left to right, using the chuck means by which 25 pieces of wafers can be transferred, the last monitor wafer M to be transferred needs a space, which equals to that space which twenty-four pieces of wafers occupy, at the right side of it.

If this space is not provided, the chuck means will strike against the handle of boat 30 and fixed dummy DW when monitor wafer M is transferred onto boat 30.

The characteristic of this second example resides in that monitor wafers M and product wafers W can be transferred onto boat 30 using common chuck means 148 but without providing a space at one end of boat 30.

As shown in FIG. 19A, chuck means 148 is kept open. Second chuck members 182 are closed to hold only monitor wafer M between them and transfer it onto boat 30, as shown in FIG. 19B.

As shown in FIG. 19C, first and second chuck members 180 and 182 are used to hold up to twenty-five pieces of wafers between them and transfer them onto boat 30.

According to chuck means 148 of the second example, therefore, monitor wafer M can be mounted on boat 30, keeping first chuck members 180 and 180 open, as shown in FIG. 21, in a case where monitor wafer M is transferred onto boat 30 at the right end thereof. This makes it unnecessary to provide a space, which is equal to that space which 24 pieces of wafers occupy, at the right end of boat 30. In addition, this prevents chuck means 148 from striking against boat 30 and fixed dummy DW.

The transferring of monitor wafer M onto boat 30 at the right end thereof was conventionally done by hand or using the chuck means which was exclusive for monitor wafer M. According to the second example of the wafers transfer device, however, the transferring of monitor wafers M and product wafers W onto boat 30 can be automatically attained by chuck means 148 which is simpler in construction. This enables wafers W to be transferred onto boat 30 with a higher efficiency and without causing chuck means 148 to be struck against boat 30 and fixed dummy DW.

According to the present invention as described above, two pairs of the chuck members for holding and transferring wafers can be opened and closed independently of the other pair. When some pieces of wafers are missing in those wafers housed in the cassette, therefore, the wafers can be re-arranged to have a certain pitch interval between them.

Further, a plurality of wafers housed in the cassette at a certain pitch interval can be transferred onto the boat at the same pitch interval as that of the wafers in the cassette or at a pitch interval an integer times that of the wafers in the cassette when first and second paired chuck members are combined with each other.

Furthermore, monitor and product wafers M and W can be automatically and efficiently transferred onto boat without using any additional space when the second chuck members are designed to hold only one wafer between them.

The above embodiments were described, referring to the case where a horizontal type furnace was employed. Needless to say, the horizontal type furnace may be replaced with a vertical type furnace.

Obviously, numerous modifications and variations of the present invention are possible in light of the above teachings. It is therefore to be understood that within the scope of the appended claims, the invention may be practiced otherwise than as specifically described herein.

What is claimed is:

1. A wafer transfer device for transferring semiconductor wafers, which are held upright in cassette means, therefrom to boat means, comprising;
   first lifter means for lifting the wafer in said cassette means;
   second filter means for lifting the wafer on said boat means;
   holder means for holding the lifted wafer; and
   conveying means for conveying the wafer held by said holder means between said cassette means and said boat means;
   said holder means including;
   a pair of main chuck members for holding one of product wafers and dummy wafers among said semiconductor wafers;
   a pair of sub-chuck members for holding a single monitor wafer to monitor quality of products, wherein said monitor wafer is located between said one of said product wafers and the dummy wafers on the boat means;
   drive means for moving said pair of sub-chuck members and said main chuck members respectively towards and away from each other and which are independent of each other;
   a plurality of main grooves formed in each of said main chuck members for receiving said product wafers;
   a sub-groove for receiving said monitor wafer;
   said main grooves and said sub-groove including a support portion for supporting the wafer and a guide portion for guiding the wafer toward the support portion, such that each of said main chuck members and each of said sub-chuck members are positioned on either side of said boat means, said monitor wafer is lifted from said boat means by said second lifter means, said sub-chuck members are simultaneously moved by said drive means, a peripheral portion of said monitor wafer is inserted into said sub-groove of said sub-chuck members, said second lifter means is lowered, and the monitor wafer is supported by the support portion of the sub-groove.

2. A wafer transfer device according to claim 1, wherein said main groove is formed at a predetermined pitch interval on each of said main chuck members.

3. A wafer transfer device according to claim 2, wherein said pair of sub-chuck members is located next to said pair of main chuck members in such a manner that the pitch interval between said sub-groove and an adjacent main groove of said main grooves is the same as that of said main grooves.

4. A wafer transfer device according to claim 1, wherein the sub-groove of each of said sub-chuck members is of substantially the same length as the main groove.

5. A wafer transfer device according to claim 1, wherein the dummy wafers are held by said main chuck members.

6. The wafer transfer device according to claim 1, wherein each of said pair of sub-chuck members has only one groove for holding a wafer therein.

* * * * *